United States Patent [19]

Honjyo et al.

[11] Patent Number: 4,849,801
[45] Date of Patent: Jul. 18, 1989

[54] SEMICONDUCTOR MEMORY DEVICE HAVING INCREASED CAPACITANCE FOR THE STORING NODES OF THE MEMORY CELLS

[75] Inventors: Shigeru Honjyo, Kokubunji; Osamu Minato, Tokyo; Yoshio Sakai, Kanagawa; Toshiaki Yamanaka, Hoya; Katsuhiro Shimohigashi; Toshiaki Masuhara, both of Tokyo, all of Japan

[73] Assignee: Hitachi, Ltd., Tokyo, Japan

[21] Appl. No.: 113,381

[22] Filed: Oct. 27, 1987

Related U.S. Application Data

[63] Continuation of Ser. No. 800,262, Nov. 21, 1985, abandoned.

[30] Foreign Application Priority Data

Nov. 28, 1984 [JP] Japan .................. 58-249550

[51] Int. Cl.⁴ ............... H01L 29/52; H01L 29/78; G11C 11/00
[52] U.S. Cl. .................... 357/51; 357/23.6; 357/29; 357/41; 357/59; 357/71; 365/154
[58] Field of Search .................... 357/23.6, 29, 41, 51, 357/59 F, 59 J, 71; 365/154

[56] References Cited

U.S. PATENT DOCUMENTS

| 4,240,097 | 12/1980 | Raymond ............... 357/51 |
| 4,453,175 | 6/1984 | Ariizumi et al. ............ 357/51 |
| 4,475,118 | 10/1984 | Klein et al. ............... 357/23.6 |
| 4,590,508 | 5/1986 | Hirakawa et al. ........... 357/23.6 |
| 4,679,171 | 7/1987 | Logwood et al. ........... 357/59 |

FOREIGN PATENT DOCUMENTS

| 53-148989 | 12/1978 | Japan ................... 357/42 |
| 59-167051 | 9/1984 | Japan ................... 357/23.6 |

OTHER PUBLICATIONS

Wang, "High Performance ... RAM", *IBM TDB*, vol. 27, No. 4A, Sep. 84.

*Primary Examiner*—Andrew J. James
*Assistant Examiner*—Jerome Jackson
*Attorney, Agent, or Firm*—Antonelli, Terry & Wands

[57] ABSTRACT

A semiconductor memory device is provided in which an electrode applied with the power supply voltage or the ground voltage is provided on an insulating layer over the drain and/or the gate of the MOS transistors constituting the memory cell of a static memory device, thereby to increasing the capacitance of the storing node of the memory cell. This semiconductor memory device significantly reduces the occurrence of soft errors.

2 Claims, 3 Drawing Sheets

4,849,801

SEMICONDUCTOR MEMORY DEVICE HAVING INCREASED CAPACITANCE FOR THE STORING NODES OF THE MEMORY CELLS

This application is a continuation of application Ser. No. 800,262, filed on Nov. 21, 1985 now abandoned.

The present invention relates to a semiconductor memory device, particularly to a MOS static memory device of high density and low power consumption.

Among the conventional MOS static memory cells, the Japanese Patent Laid Open Kokai No. 53-148989 is known as one in which the load consists of resistance. The circuit of this laid-open patent is shown in FIG. 1. In the figure, numerals 1–4 designate n-channel MOS transistors (hereinafter referred to as MOST). Numerals 1 and 2 designate transfer MOST's and numerals 3 and 4 driver MOST's. Numerals 5 and 6 designate data lines, numeral 7 a word line, and numerals 8 and 9 load resistances. Information stored in storing nodes 12 and 13 is held by supply current from a power supply line 10 (voltage: Vcc). Numeral 11 represents a ground line (voltage: Vss). Each of the above load resistances 8 and 9 can be formed by a polycrystalline silicon layer which is the same layer as that forming the gates of the MOST's 1–4. Alternatively, the load resistances can be a stacked polycrystalline silicon layer which is different from the gate material, wherein a portion of the polycrystalline silicon layer is left as an intrinsic semiconductor or made into a low impurity region to form the load resistance. Information is written into or read out from the above memory cell through the data lines 5 and 6 by changing the level of the word line 7 from the low-level voltage to the high-level voltage.

Owing to the recent processing in semiconductor technology of fine process, the static RAM tends to have higher density than previously possible. Accordingly, it is required to reduce the area occupied by the memory cell. The possibility of realizing a higher density RAM was studied on the basis of the above-mentioned prior art memory cell, and, as a result, the following defect became apparent.

$\alpha$-particles emanating, for instance, from the impurities in the packaging material are irradiated to the surface of a semiconductor memory chip to reverse the information stored in the storing node of the memory cell, whereby random errors are generated. Regarding the so-called soft error, in this memory cell, the storing capacitances C 14 and 15, composed of gate capacitance, p-n junction capacitance and so on, decreases as the area of the memory cell decreases, and the amount of stored charge $Q$ ($=C \cdot V$, V: stored voltage) decreases. As a result, the frequency of generation of the soft error due to irradiation of the $\alpha$-particles becomes higher than in former devices. Accordingly, to strengthen the resistance to soft error to the same extent as formerly, some means is needed for increasing the amount of stored charge to the same extent as former devices.

SUMMARY OF THE INVENTION

An object of the present invention is to overcome the above-mentioned defect of the prior art and provide a static memory cell occupying a small area, which can realize a high density static RAM.

A further object of the present invention is to provide a semiconductor memory device suitable for a high density memory which occupies a small area and has the same high reliability as conventional devices.

To achieve the above objects, the semiconductor memory device of the present invention is constructed by providing an electrode on an insulating layer which is located on the drain and/or the gate of the MOS transistors constituting the memory cell of a static memory device, thereby to increase the capacitance of the storing node of the memory cell. It is known that the above memory cell consists of, for instance, as described later, a circuit comprising load resistances and four MOST's, and in this case, it is advantageous to form the above-mentioned electrode, for increasing the capacitance, between the MOST's and the load resistance, namely to form the load resistance on the electrode with an insulating layer interposed between them. In addition, the power supply voltage or the ground voltage is applied to the electrode.

The basic concept of the present invention will now be explained using FIG. 2. FIG. 2 shows an example of the circuit diagram of the present invention. In the figure, numerals 16 and 17 designate the storing capacitances which are newly added to the storing nodes 12 and 13, respectively. The remaining numerals in FIG. 2 indicate the same portions as in FIG. 1. The characteristic feature of the present invention resides in that the increase of the storing capacitance is realized by the newly added capacitances which are different from the conventional stray capacitance. According to the present invention, a semiconductor memory device which strongly resists the soft error can be obtained as a result of the increase of the amount of stored charge due to the storing capacitances 16 and 17.

Even if the storing capacitances to be newly added are small, they are effective to that extent, and the effect for reducing soft errors is enhanced as the capacitances increase. Since the semiconductor memory device has the construction of an integrated circuit, the upper limits of the capacitances are thus automatically determined by the shape and size of each memory cell. The electrode for increasing the above capacitances may be constructed by an electrically conductive material which is used for integrated circuits, for instance, polycrystalline silicon. In addition, so long as insulation is maintained, it is advantageous that the above-mentioned insulating layer becomes thinner, because the capacitance becomes larger.

DESCRIPTION OF THE PREFERRED EMBODIMENTS

EMBODIMENT 1

Figure 1:
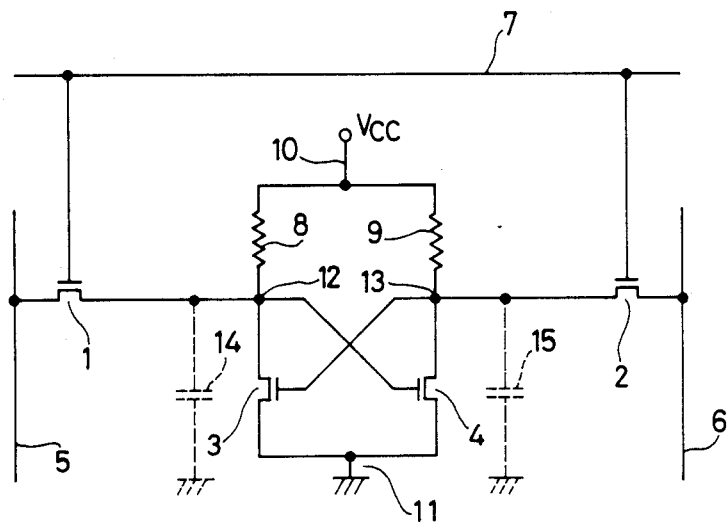
FIG. 1 is a circuit diagram showing the semiconductor memory device according to the prior art.
Figure 2:
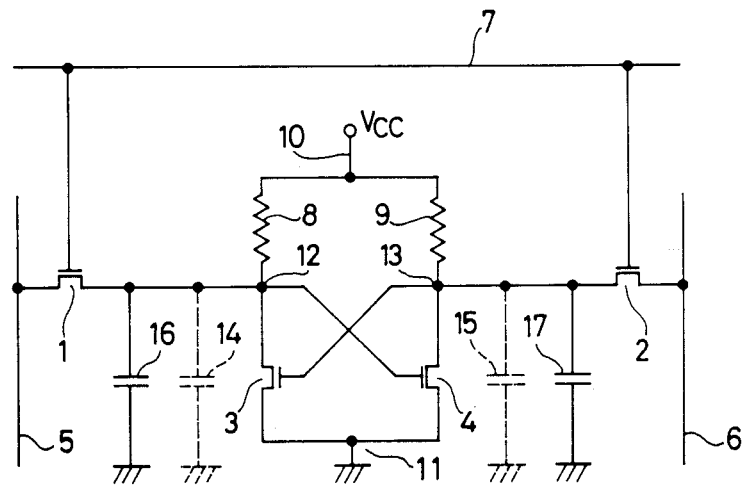
FIG. 2 is a circuit diagram showing the semiconductor memory device of an embodiment of the present invention.
Figure 3:
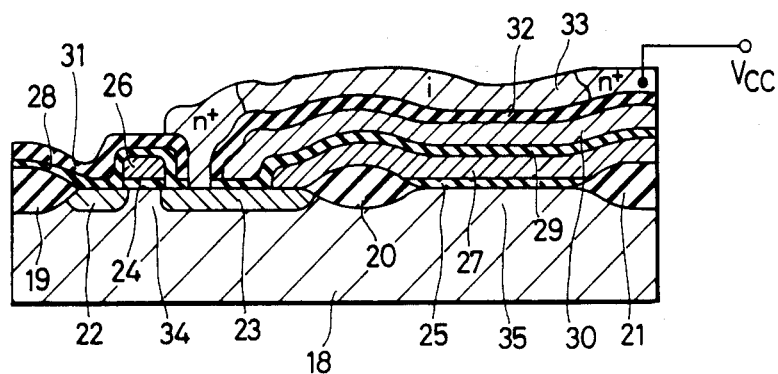
FIGS. 3, 4 and 5 are sectional views showing the structures of the semiconductor memory devices in the first, second and third embodiments of the present invention, respectively.

FIG. 3 is a sectional view showing the main structure of the semiconductor memory device of this embodiment. The circuit of this semiconductor memory device is shown in FIG. 2 as mentioned above. That is, this circuit includes the storing capacitances 16 and 17 which are newly added to the storing nodes 12 and 13 of a static semiconductor memory device comprising two driver MOST's 3 and 4 constituting a flip-flop, and two transfer MOST's 1 and 2 respectively connected to the drains of the two driver MOST's, wherein the gates and drains of the two driver MOST's are cross-connected to each other, with each drain being connected to one end of each load resistance and each source being grounded, and the other end of the load resistance is connected to a power supply, and the word line 7 and data lines 5 and 6 are connected to the transfer MOST's.

By referring to FIG. 3, the structure of the semiconductor memory device of this embodiment is explained below.

Insulating isolation layers 19, 20 and 21 are provided in a p-type substrate 18, together with an n-channel transfer MOST 34 having a drain and a source, made of n-type impurity layers 22 and 23, respectively, and gate 26, and an n-channel driver MOST 35 having a gate 27 (the source and drain thereof are not seen in this sectional view because they exist in the direction perpendicular to the surface of the paper so as to sandwich the gate). Then, the capacitances 16 and 17 shown in FIG. 2 are constructed on the MOST's 34 and 35 by sandwiching a 6000 Å-thick insulating material layer 29 ($SiO_2$ film or composite film of $SiO_2$ and $Si_3N_4$) between the storing nodes (numerals 12 and 13 in FIG. 2, and one of them corresponding to numerals 23 and 27 in FIG. 3) and an electrode 30 composed of the second polycrystalline silicon layer. After forming thereon a 4000 Å-thick insulating material layer 32 composed of, for instance, $SiO_2$, a load resistance 33 is formed by the third polycrystalline silicon layer. The power supply voltage or the ground voltage is applied to the electrode 30. In FIG. 3, numerals 24 and 25 designate gate insulating films, and numerals 28 and 31 designate insulating layers. In addition, FIG. 3 shows half of the circuit shown in FIG. 2, for instance, the structure corresponding to the portions which correspond to the transfer MOST 1, driver MOST 4, load resistance 8, storing node 12 and storing capacitance 16. The remaining half of the circuit of FIG. 2 is omitted from the drawing of FIG. 3 because it has the same structure. The same thing can be said with FIGS. 4 and 5 which are described later.

The semiconductor memory device of this embodiment is a 256 kilobit static-type one whose memory cell area is 100 $\mu m^2$, and 60% or more of the area becomes the effective area for forming the storing capacitance. As a result, the storing capacitance is remarkably increased, and the occurrence of soft errors is remarkably decreased. Namely, while the storing capacitance of the semiconductor memory device of the prior art having the same size as this embodiment and having four MOST's was 10 fF (femto-farad), the storing capacitance of the semiconductor memory device of this embodiment became 15 fF. As a result, an increase of 5 fF was obtained. For this, the soft error rate of the semiconductor memory device of this embodiment decreases by three figures as compared with the conventional device. In other words, if the soft error rate of the above conventional semiconductor memory device is assumed to be 1000 FIT, a highly reliable semiconductor memory device having the soft error rate of 1 FIT or less can be obtained by the present invention.

In addition, in the structure that the load resistance is formed after the electrode for obtaining the new capacitance is formed, as in this embodiment, the polycrystalline silicon layer forming the load resistance becomes the upper layer. Therefore, the device of this embodiment has the other advantage that, since the heat-treatment is applied only once, the heat-treatment time of the polycrystalline silicon layer can be reduced, by which the deviation of the load resistance value depending on the heat-treatment time can be made small. Accordingly, the above structure is very effective.

EMBODIMENT 2

Figure 4:
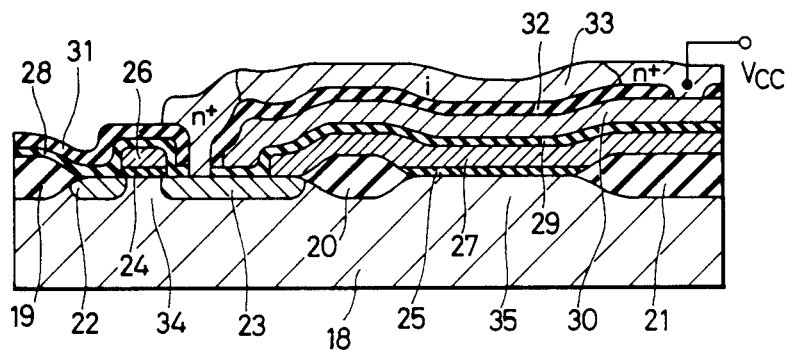

FIG. 4 is a sectional view showing the main structure of the semiconductor memory device of this embodiment. The numerals in this figure are same as those in FIG. 3. The characteristic feature of this embodiment resides in that the electrode 30 is fixed to the power supply voltage (Vcc). In this structure, the electrode of the power supply side of the load resistance 33 and the power supply side of the electrode 30 can be shared by each other. This is very effective because the wiring of the electrode 30 can be performed without increasing the area occupied by the memory cell.

Further, as in Embodiment 1, the semiconductor memory device of this embodiment also showed the effect of increasing the storing capacitance and remarkably reducing the soft error rate.

EMBODIMENT 3

Figure 5:
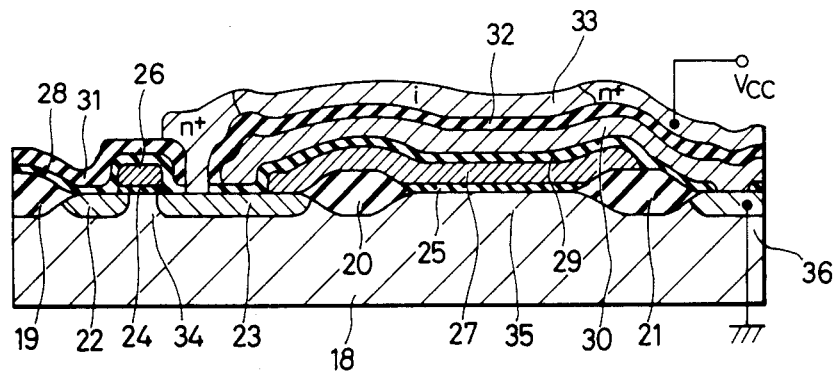

FIG. 5 is a sectional view showing the main structure of the semiconductor memory device of this embodiment. The numerals other than 36 in this figure are same as those in FIG. 3. The characteristic feature of this embodiment resides in that the electrode 30 is fixed to the ground voltage (Vss). In this structure, the ground side terminal of the memory cell 36 and the ground side of the electrode 30 can be shared by each other. This is also very effective because the wiring of the electrode 30 can be performed without increasing the area occupied by the memory cell.

In addition, as in the above-mentioned Embodiments 1 and 2, the semiconductor memory device of this embodiment also showed the effect of increasing the storing capacitance and remarkably reducing the soft error rate.

EMBODIMENT 4

Figure 6:
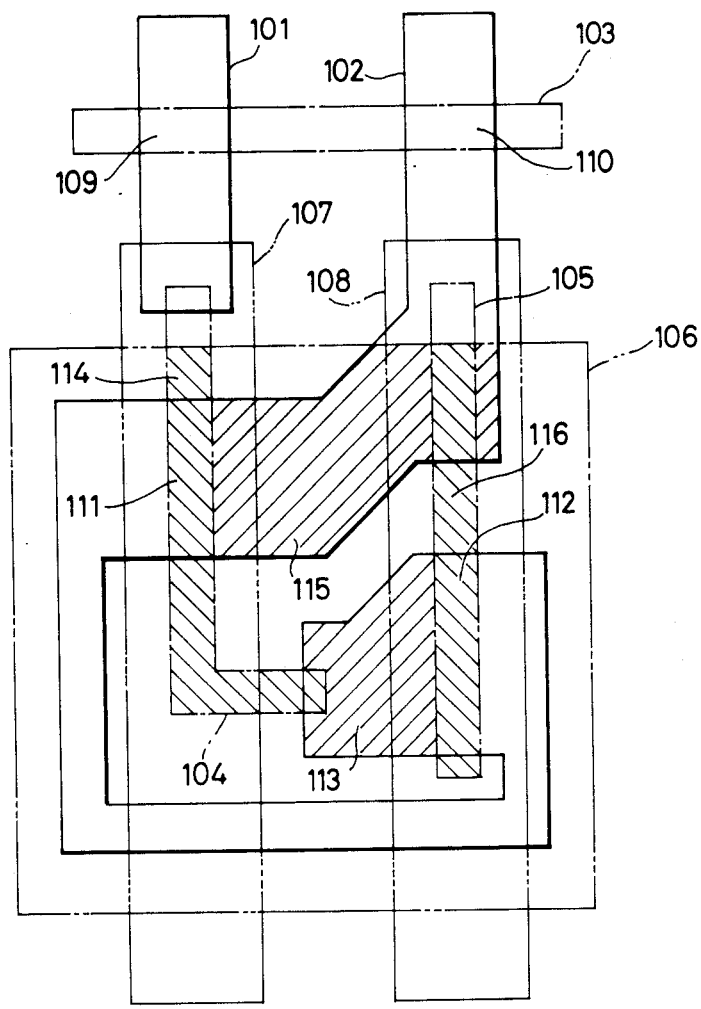
FIG. 6 is a layout pattern showing the structure of the semiconductor memory device in the fourth embodiment of the present invention.

FIG. 6 shows the layout pattern of the semiconductor memory device of this embodiment. MOST's 109, 110, 111 and 112 are formed with n-type impurity diffusion layers 101 and 102 and the first polycrystalline silicon layers 103, 104 and 105, and the storing capacitances 16 and 17 of FIG. 2 are formed with the storing node (corresponding to numeral 12 or 13 of FIG. 2) and the electrode 106 composed of the second polycrystalline silicon layer. The capacitance represented by numeral 16 (17) of FIG. 2 can be formed on the n-type impurity diffusion layer represented by numeral 113 (115) and on the first polycrystalline silicon layer represented by numeral 114 (116). Not only the electrode 106 may be common to the whole memory cell, but also all of the area occupied by the storing node in the layout pattern can be used to form the capacitance to be newly added except the contact region for connecting the load resistance (formed with the third polycrystalline silicon layers 107 and 108) and the storing node. It is thus very effective. In addition, since the electrode 106 may be fixed to either Vcc or Vss, flexibility can be given to the memory cell design. Thus, it is further effective. The hatched portions in FIG. 6 represent the portions on which the storing capacitance can be formed.

As described above, according to the present invention, a static memory cell occupying a small area and having strong resistance to the α-ray can be provided, and it is greatly effective for realizing a high density RAM.

The present embodiments have been explained for the memory cell formed on a p-type substrate, but it is needless to say that the present invention can be applied to the memory cell formed in the p-type well in a n-type substrate.

If the types of the impurities and the well used in the above explanation of the present invention are reversed, the effect of the present invention is the same. Further, it is needless to say that, if the present invention is applied to a memory cell in which the transfer MOST's consist of p-channel MOST's and the driver MOST's consist of n-channel MOST's, the same effect can be obtained.

What is claimed is:

1. A semiconductor memory device formed on a semiconductor substrate to constitute a memory cell of a static memory device, comprising first and second driver MOS transistors, first and second transfer MOS transistors and first and second load resistances, wherein gates of said first and second transfer MOS transistors are connected to a word line, wherein a drain of said first driver MOS transistor is connected to a first data line through a source-drain path of said first transfer gate MOS transistor, wherein a drain of said second driver MOS transistor is connected to a second data line through a source-drain path of said second transfer gate MOS transistor, wherein said gate of said first driver MOS transistor is connected to said drain of said second driver MOS transistor, wherein said gate of said second driver MOS transistor is connected to said drain of said first driver MOS transistor, wherein said drains of said first and second driver MOS transistors are connected to first ends of said first and second load resistances respectively, wherein second ends of said first and second load resistances are connected to a first operating potential, wherein sources of said first and second driver MOS transistors are connected to a second operating potential respectively, wherein said drain of said first driver MOS transistor is connected to said first end of said first load resistance through first conductive means, wherein said drain of said second driver MOS transistor is connected to said first end of said second load resistance through second conductive means, said gates of said first and second driver MOS transistors as well as of said first and second transfer MOS transistors being formed by a first polycrystalline silicon layer on said semiconductor substrate, wherein a first insulating material layer is formed on said first polycrystalline silicon layer, wherein a second polycrystalline silicon layer is formed on said first insulating material layer, wherein a second insulating material layer is formed on said second polycrystalline silicon layer, wherein a third polycrystalline silicon layer is formed on said second insulating material layer, wherein a first capacitance of a first node at said drain of said first driver MOS transistor and a second capacitance of a second node at said drain of said second driver MOS transistor are formed by a sandwich structure of said second polycrystalline silicon layer, said second insulating material layer and said third polycrystalline silicon layer, and wherein said first and second load resistances as well as said first and second conductive means are formed by one of said polycrystalline silicon layers of said sandwich structure other than said first polycrystalline silicon layer.

2. A semiconductor memory device according to claim 1, wherein said first and second driver MOS transistors as well as said first and second transfer MOS transistors are n-channel transistors, and wherein a voltage of said first operating potential is higher than that of said second operating potential.

* * * * *